US011482597B2

(12) United States Patent
Werner et al.

(10) Patent No.: US 11,482,597 B2
(45) Date of Patent: Oct. 25, 2022

(54) SEMICONDUCTOR WAFER HAVING EPITAXIAL LAYER

(71) Applicant: Siltronic AG, Munich (DE)

(72) Inventors: Norbert Werner, Tengling (DE); Christian Hager, Kastl (DE)

(73) Assignee: SILTRONIC AG, Munich (DE)

( * ) Notice: Subject to any disclaimer, the term of this patent is extended or adjusted under 35 U.S.C. 154(b) by 122 days.

(21) Appl. No.: 16/959,153

(22) PCT Filed: Dec. 12, 2018

(86) PCT No.: PCT/EP2018/084620

§ 371 (c)(1),
(2) Date: Jun. 30, 2020

(87) PCT Pub. No.: WO2019/137728

PCT Pub. Date: Jul. 18, 2019

(65) Prior Publication Data

US 2021/0376088 A1 Dec. 2, 2021

(30) Foreign Application Priority Data

Jan. 11, 2018 (DE) ..................... 10 2018 200 415.3

(51) Int. Cl.
*H01L 29/16* (2006.01)
*C23C 16/458* (2006.01)
*C30B 29/06* (2006.01)
*H01L 21/02* (2006.01)

(52) U.S. Cl.
CPC .......... *H01L 29/16* (2013.01); *C23C 16/4585* (2013.01); *C30B 29/06* (2013.01); *H01L 21/02381* (2013.01); *H01L 21/02532* (2013.01)

(58) Field of Classification Search
None
See application file for complete search history.

(56) References Cited

U.S. PATENT DOCUMENTS 5,355,831 A 10/1994 Schauer
6,051,498 A 4/2000 Pietsch et al.
2007/0227441 A1 10/2007 Narahara et al.
2015/0162181 A1 * 6/2015 Yamashita ........ H01L 21/02021 438/691
2015/0184314 A1 7/2015 Narahara et al.
2018/0363165 A1 12/2018 Hager et al.
2019/0106809 A1 4/2019 Haberecht

FOREIGN PATENT DOCUMENTS

DE 102015225663 A1 6/2017
DE 102016210203 B3 8/2017
EP 0857542 A1 8/1998
JP 2006190703 A 7/2006
JP 2010021441 A 1/2010
JP 2013055231 A 3/2013
JP 2014036153 A 2/2014
TW 201724248 A 7/2017
WO WO-2017102597 A1 * 6/2017 ......... C23C 16/0236

* cited by examiner

*Primary Examiner* — Erik Kielin
(74) *Attorney, Agent, or Firm* — Leydig, Voit & Mayer, Ltd.

(57) ABSTRACT

A semiconductor wafer of monocrystalline silicon. The semiconductor wafer having: a substrate wafer of monocrystalline silicon; and a layer of monocrystalline silicon that lies on a front side of the substrate wafer. The substrate wafer has a crystal orientation. An averaged front side-based ZDD of the semiconductor wafer, with a division of a surface of an epitaxial layer into 16 sectors and an edge exclusion of 1 mm, is not less than −30 nm/mm$^2$ and not more than 0 nm/mm$^2$. An ESFQR$_{max}$ of the semiconductor wafer, with an edge exclusion of 1 mm and 72 sectors each with a length of 30 mm, is at most 10 nm.

8 Claims, No Drawings

SEMICONDUCTOR WAFER HAVING EPITAXIAL LAYER

CROSS-REFERENCE TO PRIOR APPLICATIONS

This application is a U.S. National Phase Application under 35 U.S.C. § 371 of International Application No. PCT/EP2018/084620, filed on Dec. 12, 2018, and claims benefit to German Patent Application No. DE 10 2018 200 415.3, filed on Jan. 11, 2018. The International Application was published in German on Jul. 18, 2019 as WO 2019/137728 under PCT Article 21(2).

FIELD

The present invention relates to a semiconductor wafer of monocrystalline silicon, having a substrate wafer of monocrystalline silicon and a layer of monocrystalline silicon that lies atop the substrate wafer, which is referred to hereinafter as semiconductor wafer of silicon with epitaxial layer (silicon epitaxial wafer).

BACKGROUND

The production of semiconductor wafers of silicon with an epitaxial layer includes the deposition of the epitaxial layer on a substrate wafer by means of gas phase deposition (e.g., chemical vapor deposition, CVD). A particularly suitable CVD is one conducted in a single-wafer reactor under standard pressure (atmospheric pressure).

U.S. Pat. No. 5,355,831 discloses typical process parameters for such a process, which can be regarded as illustrative.

Demanding applications require semiconductor wafers of silicon with an epitaxial layer having particularly uniform edge geometry. A prerequisite for this is that the thickness of the epitaxial layer is particularly uniform.

US Patent Application Publication No. 2007/0227441 A1 points out periodic variations in the thickness of the epitaxial layer in the edge region of such semiconductor wafers of silicon. The reason is different growth rates at which the epitaxial layer grows. The different growth rates are correlated with the crystal orientation of the semiconductor wafer. In order to homogenize the thickness of the epitaxial layer in the edge region, US Patent Application Publication No. 2007/0227441 A1 proposes altering the structure of the susceptor by the period of the thickness variations.

This proposal can attenuate the problem, but is inadequate with regard to future expectations from manufacturers of electronic components.

SUMMARY

A semiconductor wafer of monocrystalline silicon. The semiconductor wafer having: a substrate wafer of monocrystalline silicon; and a layer of monocrystalline silicon that lies on a front side of the substrate wafer. The substrate wafer has a crystal orientation. An averaged front side-based ZDD of the semiconductor wafer, with a division of a surface of an epitaxial layer into 16 sectors and an edge exclusion of 1 mm, is not less than −30 nm/mm$^2$ and not more than 0 nm/mm$^2$. An ESFQR$_{max}$ of the semiconductor wafer, with an edge exclusion of 1 mm and 72 sectors each with a length of 30 mm, is at most 10 nm.

DETAILED DESCRIPTION

An embodiment of the present invention provides a semiconductor wafer of monocrystalline silicon. The semiconductor wafer includes a substrate wafer of monocrystalline silicon and a layer of monocrystalline silicon that lies on a front side of the substrate wafer. The substrate wafer has a crystal orientation. An averaged front side-based ZDD (double derivative of height Z) of the semiconductor wafer, with a division of the surface of the epitaxial layer into 16 sectors and an edge exclusion of 1 mm, is not less than −30 nm/mm$^2$ and not more than 0 nm/mm$^2$. The ESFQR$_{max}$ (maximum edge site front least-squares range) of the semiconductor wafer, with an edge exclusion of 1 mm and 72 sectors each with a length of 30 mm, is at most 10 nm.

ZDD and ESFQR are parameters that characterize the edge geometry of a semiconductor wafer, which are also addressed by SEMI standards (ZDD (SEMI M68-1015), ESFQR (SEMI M67-1015)). Front side-based ZDD describes the average near-edge curvature of the surface. ESFQR$_{max}$ denotes the ESFQR of that sector in which ESFQR is at its greatest.

A semiconductor wafer of the present invention with an epitaxial layer shows virtually no angle-dependent variations in the edge geometry of the epitaxial layer, because the production thereof envisages preventing such variations from occurring. In a departure from the customary procedure, the epitaxial layer covers virtually only the main surface of the front side of the substrate layer that determines the crystal orientation of the substrate wafer and virtually no regions of the front side that have a different crystal orientation, because an oxide layer provided at the edge of the substrate layer largely prevents the epitaxial layer from being deposited in such regions.

Expressed in terms of the front side-based ZDD (the double derivative of the height perpendicularly from the median plane to the surface of the epitaxial layer) and expressed as the average ZDD of sectors in which ZDD is determined, the edge geometry of the semiconductor wafer with an epitaxial layer, with a division of the surface of the epitaxial layer into 16 sectors and observing an edge exclusion of 1 mm, is not less than −30 nm/mm$^2$ and not more than 0 nm/mm$^2$. The oxide layer on the back side additionally prevents material from being deposited on the back side while an epitaxial layer is being deposited on the front side, hence worsening the ESFQR. Therefore, the ESFQR$_{max}$ of the semiconductor wafer is at most 10 nm, with an edge exclusion of 1 mm and 72 sectors each having a length of 30 mm.

The diameter of a semiconductor wafer of the present invention is preferably not less than 300 mm, more preferably 300 mm.

The production of a semiconductor wafer of an embodiment of the invention preferably includes the following steps:

- providing of a substrate wafer of monocrystalline silicon;
- producing of an oxide layer on the substrate wafer;
- asymmetric double-sided polishing of the substrate wafer that partly removes the oxide layer and restricts the extent thereof on the back side and on the surface of an edge region of the substrate wafer;
- CMP on the front side of the substrate wafer;
- depositing of the epitaxial layer of monocrystalline silicon on the front side of the substrate wafer; and
- removing of the oxide layer from the substrate wafer.

According to an embodiment of the present the invention, the region of the edge and the back side of the substrate wafer is masked with an oxide layer, and the CMP (chemical mechanical polishing) step creates a mirror-polished front side of the substrate wafer consisting (for the most part) of a main surface with uniform crystal orientation. The crystal orientation of the main surface of the front side of the substrate wafer is preferably a {100} orientation or a {110} orientation. The epitaxial layer is subsequently deposited on the front side. There is now barely any occurrence of angle-dependent variations in the thickness of the epitaxial layer. Such variations originate from the deposition of the epitaxial layer on surfaces with different crystal orientation and at different deposition rates associated therewith. The presence of the oxide layer prevents deposition of an epitaxial layer thereon.

Asymmetric double-sided polishing here means double-sided polishing in which material is removed more quickly on the front side than on the back side, and at the end of which the oxide layer has been completely polished away from the front side, while it is still present on the back side. EP 0 857 542 A1, for example, describes how asymmetric removal of material can be brought about.

The oxide layer is a layer of silicon dioxide and is preferably produced by means of CVD, more preferably by means of AP-CVD (atmospheric pressure CVD). Alternatively, the oxide layer can also be produced by means of LP-CVD (low pressure CVD) or thermally. The oxide layer preferably has a thickness of not less than 5 nm and not more than 100 nm. The substrate wafer is at first fully covered by the oxide layer. Subsequently, the substrate wafer is subjected to asymmetric DSP polishing, in the course of which the oxide layer on the front side of the substrate wafer is removed, but the oxide is conserved on the back side and in the region of the edge. This is followed by single-sided CMP polishing of the front side of the substrate wafer. The result of this procedure is that no oxide layer is present any longer in the CMP-polished regions of the substrate wafer.

The epitaxial layer is deposited on the front side of the substrate wafer, which is free of the oxide layer. Native oxide may be removed prior to the deposition of the epitaxial layer by a treatment of the front side with hydrogen ($H_2$ bake). On deposition of the epitaxial layer, the substrate wafer lies on the susceptor of a CVD reactor such that the front side is exposed to the deposition gas. Since the crystal orientation of the front side is virtually uniform and is preferably a {100} crystal orientation or a {110} crystal orientation, the epitaxial layer grows with a virtually uniform deposition rate on the front side of the substrate wafer. Accordingly, the thickness of the epitaxial layer is essentially uniform. Angle-dependent variation in the thickness of the epitaxial layer in the edge region is virtually undetectable because the oxide layer is a barrier to epitaxial deposition in the edge region that is the cause thereof.

The thickness of the epitaxial layer of silicon is preferably 1 to 15 μm, more preferably 1 to 7 μm. The deposition temperature is preferably in the range from 900° C. to 1250° C. The deposition gas contains a silane, preferably trichlorosilane, as silicon source and hydrogen.

After the epitaxial layer has been deposited, the oxide layer is removed, preferably by a wet-chemical route by means of a chemical containing hydrogen fluoride and optionally hydrogen chloride and/or ammonium fluoride. The concentration of hydrogen fluoride is preferably 0.2% by weight to 49% by weight. The wet-chemical step may be part of a cleaning sequence, in the course of which the semiconductor wafer is treated with further chemicals, for example with ozone water and/or with SC1 solution. In a departure from this, the oxide layer can also be removed under dry conditions, for example by means of plasma etching or reactive ion etching (RIE).

Example

A substrate wafer of monocrystalline silicon having a diameter of 300 mm and {100} orientation of the front side was fully coated with an oxide layer in a CVD reactor. Thereafter, the substrate wafer was subjected first to polishing by means of DSP (with a hard (more material-removing) polishing cloth on the front side and a soft (less material-removing) polishing cloth on the back side) and then to polishing of the front side by means of CMP, and cleaned.

This was followed by the deposition of an epitaxial layer of monocrystalline silicon on the front side of the substrate wafer by means of CVD in an Applied Materials Centura® single-wafer reactor. The thickness of the epitaxial layer was 2.8 μm.

Subsequently, the oxide layer was removed from the edge and the back side of the resultant epitaxially coated semiconductor wafer in a bath that contained hydrogen fluoride.

The semiconductor wafer was cleaned and dried and subjected to a measurement of edge geometry. With an edge exclusion of 1 mm and a division of the epitaxial layer into 16 sectors, the average front side-based ZDD, measured with a KLA-Tencor Wafersight instrument, was −27 nm/mm$^2$; the $ESFQR_{max}$ was 8 nm with an edge exclusion of 1 mm and 72 sectors each with length 30 mm.

Comparative Example

A further substrate wafer of monocrystalline silicon having the properties of that from the example was coated as in the example with an epitaxial layer of monocrystalline silicon. However, production of the oxide layer was omitted. Omitting this had a clear adverse effect on the edge geometry of the resultant semiconductor wafer: the corresponding front side-based average ZDD had a value of −120 nm/mm2 and a corresponding $ESFQR_{max}$ of 23 nm.

While embodiments of the invention have been illustrated and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A semiconductor wafer of monocrystalline silicon, the semiconductor wafer comprising:

a substrate wafer of monocrystalline silicon; and a layer of monocrystalline silicon that lies on a front side of the substrate wafer, wherein the substrate wafer has a crystal orientation, wherein an averaged front side-based double derivative of a height Z (ZDD) of the semiconductor wafer, with a division of a surface of an epitaxial layer into 16 sectors and an edge exclusion of 1 mm, is not less than −30 nm/mm2 and not more than 0 nm/mm$^2$, and wherein a maximum edge site front least-squares range ($ESFQR_{max}$) of the semiconductor wafer, with an edge exclusion of 1 mm and 72 sectors each with a length of 30 mm, is at most 10 nm.

2. The semiconductor wafer of monocrystalline silicon as claimed in claim 1, wherein the crystal orientation is a {100} orientation.

3. The semiconductor wafer of monocrystalline silicon as claimed in claim 1, wherein the crystal orientation is a {110} orientation.

4. The semiconductor wafer of monocrystalline silicon as claimed in claim 1, wherein a diameter of the semiconductor wafer is not less than 300 mm.

5. The semiconductor wafer of monocrystalline silicone as claimed in claim 1, wherein ZDD is determined according to SEMI M68-1015 and $ESFQR_{max}$ is determined according to SEMI M67-1015.

6. The semiconductor wafer of monocrystalline silicone as claimed in claim 1, further comprising an oxide layer at an edge of the substrate wafer.

7. The semiconductor wafer of monocrystalline silicone as claimed in claim 1, further comprising an oxide layer on a back side of the semiconductor wafer.

8. The semiconductor wafer of monocrystalline silicone as claimed in claim 1, wherein the layer of monocrystalline silicon is not present at an edge region of the semiconductor wafer or on a back side of the semiconductor wafer.

* * * * *